(12) United States Patent
Wang et al.

(10) Patent No.: US 8,436,418 B2
(45) Date of Patent: May 7, 2013

(54) HIGH-VOLTAGE SEMICONDUCTOR DEVICE WITH ELECTROSTATIC DISCHARGE PROTECTION

(75) Inventors: Chih-Chung Wang, Hsinchu (TW); Wei-Lun Hsu, Hsin-Chu Hsien (TW); Te-Yuan Wu, Hsinchu (TW); Ke-Feng Lin, Taipei (TW); Shan-Shi Huang, Hsinchu (TW); Ming-Tsung Lee, Yilan County (TW); Wen-Fang Lee, Hsin-Chu (TW)

(73) Assignee: United Microelectronics Corp., Science-Based Industrial Park, Hsin Chu (TW)

( * ) Notice: Subject to any disclaimer, the term of this patent is extended or adjusted under 35 U.S.C. 154(b) by 108 days.

(21) Appl. No.: 13/163,734

(22) Filed: Jun. 20, 2011

(65) Prior Publication Data
US 2012/0319189 A1    Dec. 20, 2012

(51) Int. Cl.
*H01L 29/94* (2006.01)
(52) U.S. Cl.
USPC .......................................................... 257/328
(58) Field of Classification Search .................. 257/488, 257/491–491, 328, 329, 492, 500
See application file for complete search history.

(56) References Cited

U.S. PATENT DOCUMENTS

| 5,637,900 | A | 6/1997 | Ker | |
| 5,959,820 | A | 9/1999 | Ker | |
| 6,724,677 | B1 | 4/2004 | Su | |
| 6,873,011 | B1 * | 3/2005 | Huang et al. | 257/345 |
| 6,909,149 | B2 | 6/2005 | Russ | |
| 7,009,252 | B2 | 3/2006 | Lin | |
| 7,027,276 | B2 | 4/2006 | Chen | |
| 7,205,612 | B2 | 4/2007 | Cai | |
| 7,368,761 | B1 | 5/2008 | Lai | |
| 7,602,025 | B2 * | 10/2009 | Nishimura et al. | 257/378 |
| 7,672,100 | B2 | 3/2010 | Van Camp | |
| 8,053,843 | B2 * | 11/2011 | Liu et al. | 257/370 |
| 2003/0076636 | A1 | 4/2003 | Ker | |
| 2006/0152868 | A1 * | 7/2006 | Ker et al. | 361/56 |
| 2006/0267102 | A1 | 11/2006 | Cheng | |
| 2006/0273399 | A1 * | 12/2006 | Liu et al. | 257/355 |
| 2008/0061367 | A1 * | 3/2008 | Williams et al. | 257/336 |
| 2008/0067588 | A1 * | 3/2008 | Williams et al. | 257/343 |
| 2008/0088994 | A1 * | 4/2008 | Lai | 361/56 |
| 2008/0217656 | A1 * | 9/2008 | Huang | 257/203 |
| 2009/0140340 | A1 * | 6/2009 | Kao | 257/357 |
| 2009/0268357 | A1 * | 10/2009 | Reynders et al. | 361/56 |
| 2010/0301385 | A1 * | 12/2010 | Tu et al. | 257/137 |

* cited by examiner

*Primary Examiner* — Nathan Ha
(74) *Attorney, Agent, or Firm* — Winston Hsu; Scott Margo

(57) ABSTRACT

The present invention provides a high-voltage semiconductor device including a deep well, a first doped region disposed in the deep well, a high-voltage well, a second doped region disposed in the high-voltage well, a first gate structure disposed on the high-voltage well between the second doped region and the first doped region, a doped channel region disposed in the high-voltage region and in contact with the second doped region and the deep well, and a third doped region disposed in the high-voltage well. The high-voltage well has a first conductive type, and the deep well, the first doped region, the second doped region, the doped channel region, and the third doped region have a second conductive type different from the first conductive type.

20 Claims, 3 Drawing Sheets

HIGH-VOLTAGE SEMICONDUCTOR DEVICE WITH ELECTROSTATIC DISCHARGE PROTECTION

BACKGROUND OF THE INVENTION

1. Field of the Invention

The present invention relates to a high-voltage semiconductor device, and more particularly, to a high-voltage semiconductor device integrating a high-voltage metal-oxide-semiconductor transistor with an electrostatic discharge protection device.

2. Description of the Prior Art

Current electrical power systems provide an alternating current having a variety of frequencies ranging from 50 to 60 Hz, and a voltage ranging from 100 volts to 240 volts, and with the differences of the electrical devices, operating voltage and frequencies also different. Thus, in order to provide a voltage corresponding to the operating voltage range of an electrical device, electrical device generally has a power conversion circuit disposed therein or at the outside thereof to electrically connect to the electrical power system, and a high voltage generated by the electrical power system can be reduced by the power conversion circuit to be corresponding to the operating voltage range of an internal circuit in the electrical device.

An input end of the power conversion circuit should be directly electrically connected to the electrical power system, so a device in the power conversion circuit, which is directly electrically connected to the electrical power system, should endure an alternating voltage ranging from 100 volts to 240 volts. A high-voltage semiconductor device can serve as the device in the power conversion circuit, which is directly electrically connected to the electrical power system, and is widely applied to the power conversion circuit in electrical devices, such as CPU power supplies, power management systems, AC/DC converters, LCDs and plasma television drivers, automobile electronic components, computer peripheral devices, small DC motor controllers, and lighting systems, etc., due to being capable of enduring the high voltage provided by the electrical power system and having switching characterize together. However, electrostatic discharge event easily occurs in the input end of the power conversion circuit that is directly electrically connected to the electrical power system, and the static charges enter into the internal circuit through the power conversion circuit, so that the internal circuit would be damaged by the static charges, and the electrical device malfunctions.

As a result, to prevent the internal circuit of the electrical device from being damaged by the ESD event generated from the input pad is an important objective in this field.

SUMMARY OF THE INVENTION

It is therefore a primary objective of the present invention to provide a high-voltage semiconductor device to prevent the internal circuit from being damaged by the ESD event generated from the input pad.

According to an embodiment of the present invention, a high-voltage semiconductor device is disclosed. The high-voltage semiconductor device includes a substrate, a deep well, a first doped region, a high-voltage well, a second doped region, a first gate structure, a doped channel region, and a third doped region. The substrate has a first conductive type. The deep well is disposed in the substrate, and has a second conductive type different from the first conductive type. The first doped region is disposed in the deep well, and has the second conductive type. The high-voltage well is disposed in the substrate, and has the first conductive type. The second doped region is disposed in the high-voltage well, and has the second conductive type. The first gate structure is disposed on the high-voltage well between the first doped region and the second doped region. The doped channel region is disposed in the high-voltage well and in contact with the second doped region and the deep well, and the doped channel region has the second conductive type. The third doped region is disposed in the high-voltage well, and the third doped region has the second conductive type.

According to another embodiment of the present invention, a high-voltage semiconductor device is disclosed. The high-voltage semiconductor device includes a depletion mode high-voltage metal-oxide-semiconductor (HV MOS) transistor and an electrostatic discharge (ESD) protection device. The depletion mode HV MOS transistor has a first source and a first drain, wherein the first drain is electrically connected to a high-voltage power, and the first source is electrically connected to an internal circuit. The ESD protection device is electrically connected between the first source and a ground to provide an ESD path between the first source and the ground.

The high-voltage semiconductor device of the present invention integrates the ESD protection device and the depletion mode HV MOS transistor to effectively introduce the static charges from the first drain to the ground. Thus, the internal circuit electrically connected to the first source can be protected. In addition, the N-type second doped region of the high-voltage semiconductor device in the present invention serves as the second drain and the first source together, and thus, the cost of manufacturing the ESD protection device can be effectively saved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
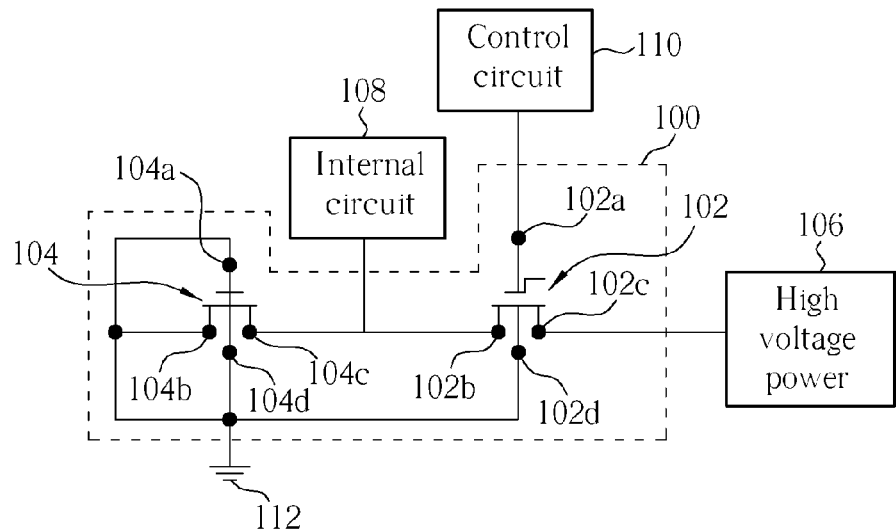
FIG. 1 is a circuit diagram illustrating a high-voltage semiconductor device according to a first preferred embodiment of the present invention.

Refer to FIG. 1, and FIG. 1 is a circuit diagram illustrating a high-voltage semiconductor device according to a first preferred embodiment of the present invention. As shown in FIG.

1, the high-voltage semiconductor device 100 includes a high-voltage metal-oxide-semiconductor (HV MOS) transistor 102, and an electrostatic discharge (ESD) protection device 104. The HV MOS transistor 102 has a first gate 102a, a first source 102b, a first drain 102c, and a first base 102d. The first drain 102c is electrically connected to a high-voltage power 106, such as a super high-voltage power providing 500 volts to 800 volts, and the first source 102b is electrically connected to an internal circuit to provide a stable voltage, such as 7.5 volts, to the internal circuit 108. The first gate 102a is electrically connected to a control circuit 110, such as a low dropout regulator, so as to control the switch of the HV MOS transistor 102, but the present invention is not limited herein. The ESD protection device 104 is electrically connected between the first source 102b and a ground to provide an ESD path between the first source and the ground, so that static electricity in the first source 102b can be discharged to the ground 112. In the present invention, it should be noted that the HV MOS transistor 102 is a depletion mode HV MOS transistor, and thus, when the first drain 102c is electrically connected to the high-voltage power 106, no voltage difference is provided between the first gate 102a and the first source 102b of the HV MOS transistor 102, and the HV MOS transistor 102 is in an ON-state. Thus, the high voltage provided from the high-voltage power 106 can be reduced by the HV MOS transistor 102, and the first source 102b can provide the stable voltage to the internal circuit 108. In addition, when ESD event occurs in the first drain 102c or the high-voltage power 106, the static charges pass through the HV MOS transistor 102 to the first source 102b. Then, the ESD protection device 104 is triggered by the static charges to be turned on, so that the static charges in the first source 102b can be discharged to the ground 112.

In this embodiment, the HV MOS transistor 102 is an N-type HV MOS (HV NMOS) transistor, and the ESD protection device 104 is an NMOS transistor, but the present invention is not limited herein. The HV MOS transistor also can be P-type HV MOS (HV PMOS) transistor, and the ESD protection device also can be PMOS transistor. The NMOS transistor 104 has a second gate 104a, a second source 104b, a second drain 104c, and a second base 104d, and the second gate 104a and the second source 104b are electrically connected to the ground 112, so that the NMOS transistor 104 is a gate-grounded NMOS (GGNMOS) transistor. The second base 104d and the first base 102d are also electrically connected to the ground 112, and the second drain 104c is electrically connected to the first source 102b. Accordingly, when no ESD events occur in the first drain 102c and the high-voltage power 106, the NMOS transistor 104 is in an OFF-state due to the second gate 104a being grounded, and the first source 102b can provide the stable voltage to the internal circuit 108. When the ESD event occurs in the first drain 102c or the high-voltage 106, the static charges are introduced to the first source 102b and the second drain 104c, and trigger the NMOS transistor 104 to turn on the NMOS transistor 104. Thus, the static charges can be introduced from the first source 102b to the second source 104b and the ground 112.

Figure 2:
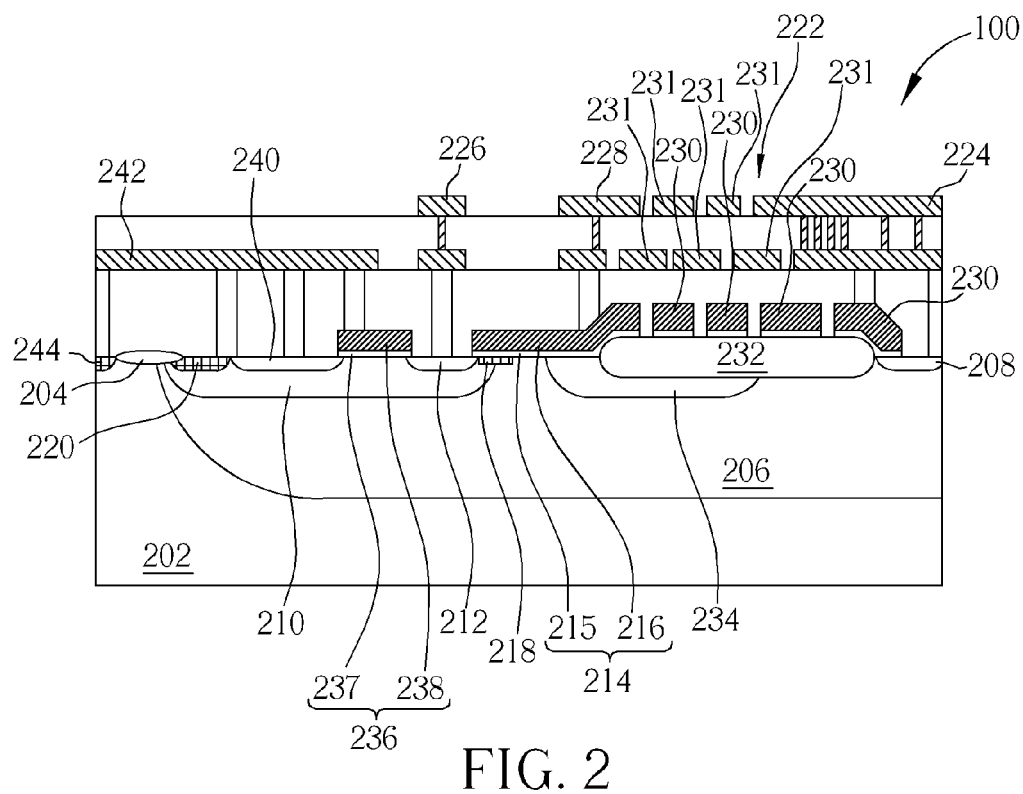
FIG. 2 is a schematic diagram illustrating a cross-sectional view of the high-voltage semiconductor device according to the first preferred embodiment of the present invention.

The following description further details the structure of the high-voltage semiconductor device integrating the depletion mode HV NMOS transistor and the NMOS transistor. Refer to FIG. 2 together with FIG. 1. FIG. 2 is a schematic diagram illustrating a cross-sectional view of the high-voltage semiconductor device according to the first preferred embodiment of the present invention. As shown in FIG. 1 and FIG. 2, the high-voltage semiconductor device 100 is fabricated on a substrate 202, such as a silicon substrate, and the substrate 202 has a first conductive type, such as P type. Furthermore, the high-voltage semiconductor device 100 and other electrical devices adjacent thereto are isolated by at least one isolation structure 204, such as a field oxide layer or at least one shallow trench, and the isolation structure 204 is disposed on the substrate 202 between the high-voltage semiconductor device 100 and other electrical device. The high-voltage semiconductor device 100 includes a deep well 206, a first doped region 208, a high-voltage well 210, a second doped region 212, a first gate structure 214, a doped channel region 218, a fourth doped region 220, and a voltage endurance structure 222. The high-voltage well 210 and the fourth doped region 220 have the first conductive type, and the deep well 206, the first doped region 208, the second doped region 212 and the doped channel region 218 have a second conductive type, such as N type, different from the first conductive type. The present invention is not limited to this, and the first conductive type and the second conductive type also can be exchanged. Moreover, the first doped region 208 and the second doped region 212 that have the second conductive type can be composed of a heavily doped region and a grade region respectively, and the heavily doped region is disposed in the grade region. The present invention is not limited to this.

In this embodiment, the N-type deep well 206, the N-type first doped region 208, the P-type high-voltage well 210, the N-type second doped region 212, the N-type doped channel region 218, the first gate structure 214, and the voltage endurance structure 222 constitute the depletion mode HV NMOS transistor 102. The N-type deep well 206 is disposed in the P-type substrate 202, and serves as the first drain 102c. The N-type first doped region 208 is disposed in the N-type deep well 206, and is used to electrically connect the N-type deep well 206 to a drain pad 224 that is a high-voltage input pad used to be electrically connected to the high-voltage power 106. The P-type high-voltage well 210 is disposed in the N-type deep well 206 between the N-type first doped region 208 and the isolation structure 204, and N-type deep well 206 surrounds the P-type high-voltage well 210. Furthermore, the P-type high-voltage well 210 serves as the first base 102d. The N-type second doped region 212 is disposed in the P-type high-voltage well 210 adjacent to the N-type first doped region 208, and serves as the first source 102b, so that the N-type second doped region 212 is electrically connected to a source pad 226. The P-type fourth doped region 220 is disposed in the P-type high-voltage well 210 between the N-type second doped region 212 and the isolation structure 204, and is used to electrically connect the P-type high-voltage well 210 to the outside. The first gate structure 214 is composed of a first gate dielectric layer 215 and a gate electrode 216, and is disposed on the P-type high-voltage well 210 between the N-type first doped region 208 and the N-type second doped region 212. The first gate electrode 216 is disposed on the first gate dielectric layer 215, and serves as the first gate 102a, so that the first gate electrode 216 is electrically connected to a gate pad 228. The N-type doped channel region 218 is disposed in the P-type high-voltage well 210 adjacent to the first gate structure 214, and is in contact with the N-type second doped region 212 and the N-type deep well 206 so as to serve as a channel region of the depletion mode HV NMOS transistor 102. It should be noted that the N-type doped channel region 218 is in contact with the N-type second doped region 212 serving as the first source 102b and the N-type deep well 206 serving as the first drain 102c, so that the depletion mode HV NMOS transistor 102 can be in the ON-state when no voltage is provided to the first gate 102a. In the present invention, a method for electrically connecting the N-type first doped region 208 to the drain pad 224, a method for electrically connect the N-type second doped region 212 to the drain pad 226, and a method for electrically connecting the first gate electrode 216 to the gate pad 228 can be performed by metal-interconnect structures that is well known by those skilled in the art, and the details of which are not further explained herein for the sake of brevity.

In addition, the voltage endurance structure 222 is disposed between the N-type first doped region 208 and the P-type high-voltage well 210, and includes at least one or a combination of a plurality of polysilicon field plates 230, a plurality of metal field plates 231, a first insulating layer 232, and a P-type fifth region 234. The first insulating layer 232 is disposed on a part of the N-type deep well 206 between the N-type first doped region 208 and the P-type high-voltage well 210, and is used to isolate a high electric field extended from the N-type first doped region 208 so as to avoid damaging the first gate dielectric layer 215. Furthermore, the first gate structure 214 can be extended onto a part of the first insulating layer 232. The P-type fifth doped region 234 is disposed in the N-type deep well 206 and in contact with the first insulating layer 232, and is further extended to be in contact with the first gate dielectric layer 214. In this embodiment, a part of the N-type deep well 206 is disposed between the P-type fifth doped region 234 and the P-type high-voltage well 210, and is in contact with the first gate structure 214. The polysilicon field plates 230 and the metal field plates are disposed on the first insulating layer 232, and the polysilicon field plates 230 and the metal field plates respectively are arranged sequentially from a side adjacent to the first gate electrode 216 to the other side adjacent to the N-type first doped region 208. Also, the polysilicon field plates 230 and the first gate electrode 216 can be formed by performing the same etching process on the same polysilicon layer, but the present invention is not limited herein. The metal field plates 231 is disposed on the polysilicon field plates 230, and at least one insulating layer is used to electrically insulate the metal field plates 231 and the polysilicon field plates 230. The polysilicon field plate 230 that is disposed most adjacent to the N-type first doped region 208 is electrically connected to the N-type first doped region 208, and the other polysilicon field plates 230 and the metal field plates 231 are floated. The present invention is not limited to this, and the electrical connection of the polysilicon field plates 230 and the metal field plates 231 can be adjusted according to the required condition of the voltage endurance. When the first drain 102c of the depletion mode HV NMOS transistor 102 is provided with a high voltage, the voltage endurance structure 222 can resist the high electric field generated from the N-type first doped region 208, so that each junction structure cannot be broken down, and the first drain 102c can be directly electrically connected to a electrical power system. In addition, the first insulating layer 232 can be a field oxide layer, but the present invention is not limited to this. The insulating layer of the present invention also can be at least one shallow trench isolation structure.

Furthermore, the high-voltage semiconductor device 100 further includes a second gate structure 236, and an N-type third doped region 240, and the N-type second doped region 212, the N-type third doped region 240, the P-type high-voltage well 210 and the second gate structure 236 constitute the NMOS transistor 104 and serves as the ESD protection device. The N-type third doped region 24 is disposed in the P-type high-voltage well 210 between the N-type second doped region 212 and the P-type fourth doped region 220, and serves as the second source 104b of the NMOS transistor 104. The N-type second doped region 212 serves as the second drain 104c of the NMOS transistor 104, so that the first source 104b and the second drain 104c share the N-type second doped region 212 together, and the first source 104b can be electrically connected to the second drain 104c. The second gate structure 236 can be composed of a second dielectric layer 237 and a second gate electrode 238, and is disposed on the P-type high-voltage well 210 between the N-type second doped region 212 and the N-type third doped region 240. Accordingly, the second gate electrode 238 can serves as the second gate 104a of the NMOS transistor 104. Moreover, the P-type high-voltage well 210 not only can serve as the first base 102d of the depletion mode HV NMO transistor 102 but also can serve as the second base 104d of the NMOS transistor 104, so that the first base 102d is electrically connected to the second base 104d. In addition, the P-type fourth doped region 220, the N-type third doped region 240 and the second gate electrode 238 are electrically connected to a same conductive layer 242 through different contact plugs so as to be electrically connected to one another, and the NMOS transistor 104 can be the GGNMOS transistor. The conductive layer 242 also can be electrically connected to a P-type sixth doped region 244 disposed in the P-type substrate 202 through a contact plug so as to be electrically connected to the P-type substrate 202, and the P-type high-voltage well 210 serving as the first base 102d and the second base 104d can have the same voltage level as the P-type substrate 202, but the present invention is not limited herein.

As the above-mentioned, when the ESD event occurs in the drain pad 224 or the high-voltage power 106, the static charges are introduced sequentially through the N-type first doped region 208, the N-type deep well 206 and the N-type doped channel region 218 to the N-type second doped region 212. Next, the GGNMOS transistor 104 is triggered by the static charges, and then, the static charges can pass through the P-type high-voltage well 210 and the N-type third doped region 240 and can be introduced to the ground 112. For this reason, the internal circuit 108 electrically connected to the first source 102b can be prevented from being damaged by the ESD event generated from the drain pad 224 or the high-voltage power 106, and the internal circuit 108 having various semiconductor devices can be effectively protected. Furthermore, the high-voltage semiconductor device 200 of this embodiment uses the N-type second doped region 212 serving as the second drain 104c of the NMOS transistor 104 and the first source 102b of the depletion mode HV MOS transistor 102 together. Thus, only the second gate dielectric layer 236, the second gate electrode 238 and the N-type third doped region 240 are required to be added, and the NMOS transistor 104 and the depletion mode HV MOS transistor 102 can be integrated together. Accordingly, the cost of manufacturing the ESD protection device can be effectively saved.

The high-voltage semiconductor device of the present invention is not limited to the above-mentioned embodiment. The following description continues to detail the other embodiments or modifications, and in order to simplify and show the differences between the other embodiments or modifications and the above-mentioned embodiment, the same numerals denote the same components in the following description, and the same parts are not detailed redundantly.

Figure 3:
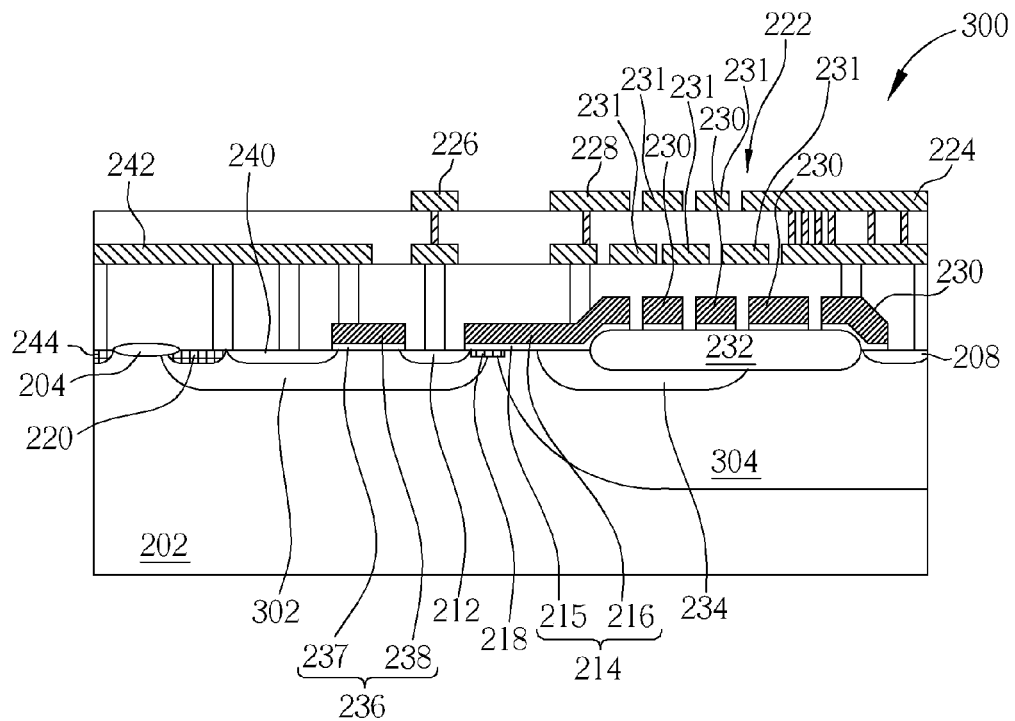
FIG. 3 is a schematic diagram illustrating a cross-sectional view of a high-voltage semiconductor device according to the second preferred embodiment of the present invention.

The P-type high-voltage well of the present invention is not limited to be disposed in the N-type deep well. Refer to FIG. 3, and FIG. 3 is a schematic diagram illustrating a cross-sectional view of a high-voltage semiconductor device according to the second preferred embodiment of the present invention. As shown in FIG. 3, as compared with the first embodiment, the P-type high-voltage well 302 of the high-voltage semiconductor device 300 in this embodiment is disposed in the P-type substrate 202, and is in contact with the P-type substrate 202. Also, the N-type deep well 304 is not in contact with the P-type high-voltage well 302, and is only in contact with the N-type doped channel region 218.

Figure 4:
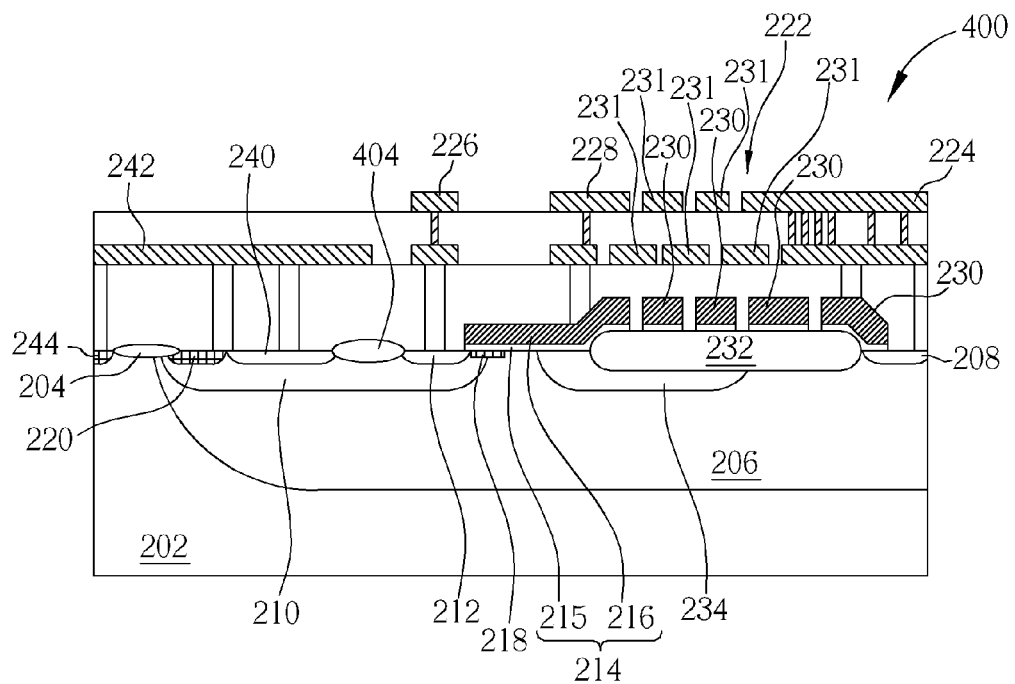
FIG. 4 a circuit diagram illustrating a high-voltage semiconductor device according to a third preferred embodiment of the present invention.

Furthermore, the ESD protection device of the present invention is not limited to be the MOS transistor, and also can be other kinds of the ESD protection devices, such as bipolar junction transistor (BJT) or silicon-controlled rectifier (SCR), etc. Refer to FIG. 4, and FIG. 4 a circuit diagram illustrating a high-voltage semiconductor device according to a third preferred embodiment of the present invention. As shown in FIG. 4, as compared with the first embodiment, the ESD protection device of the high-voltage semiconductor 400 in this embodiment is an NPN-type BJT, but is not limited to this. When the HV MOS transistor is the P-type HV MOS transistor, the ESD protection device also can be a PNP-type BJT. In this embodiment, the NPN-type 402 has an emitter 402a, a third base 402b and a collector 402c. The emitter 402a and the third base 402b are electrically connected to the ground 112, and the collector 402c is electrically connected to the first source 102b.

Figure 5:
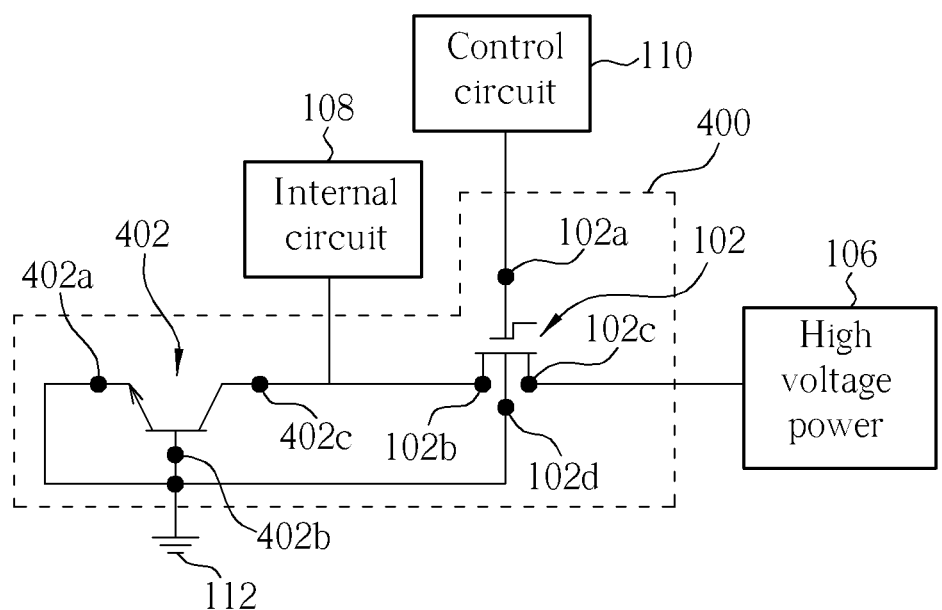
FIG. 5 is a schematic diagram illustrating a cross-sectional view of the high-voltage semiconductor device according to the third preferred embodiment of the present invention.

The following description further details the structure of the high-voltage semiconductor device integrating the depletion mode HV NMOS transistor and the NMOS transistor according to the third embodiment. Refer to FIG. 5 together with FIG. 4. FIG. 5 is a schematic diagram illustrating a cross-sectional view of the high-voltage semiconductor device according to the third preferred embodiment of the present invention. As shown in FIG. 4 and FIG. 5, as compared with the first embodiment, the high-voltage semiconductor device 400 of this embodiment does not have the second gate structure, and further includes a second insulating layer 404 disposed on the P-type high-voltage well 210 between the N-type second doped region 212 and the N-type third doped region 240. Thus, the second insulating layer 404 can electrically insulate the N-type second doped region 212 from the N-type third doped region 240. In this embodiment, the N-type second doped region 212, the N-type third doped region 240 and the P-type high-voltage well 210 constitute the NPN-type BJT. The N-type second doped region 212 serves as the collector 402c. The P-type high-voltage well 210 serves as the third base 402b. The N-type third doped region 240 serves as the emitter 402a. In addition, the N-type third doped region 240 is not limited to be disposed between the P-type fourth doped region 220 and the N-type second doped region 212. In other embodiments of the present invention, a position of the P-type fourth doped region 220 and a position of the N-type third doped region 240 also can be exchanged.

In summary, the high-voltage semiconductor device of the present invention integrates the ESD protection device and the depletion mode HV MOS transistor electrically connected to the electric power system to effectively introduce the static charges from the first drain to the ground. Thus, the internal circuit electrically connected to the first source can be protected. In addition, the N-type second doped region of the high-voltage semiconductor device in the present invention serves as the second drain and the first source together. Thus, only the N-type third doped region and the second insulating layer or the N-type third doped region, the second gate dielectric layer and the second gate electrode are required to be added, and the NMOS transistor 104 and the depletion mode HV MOS transistor can be integrated together. Accordingly, the cost of manufacturing the ESD protection device can be effectively saved.

Those skilled in the art will readily observe that numerous modifications and alterations of the device and method may be made while retaining the teachings of the invention.

What is claimed is:

1. A high-voltage semiconductor device, comprising:
a substrate, having a first conductive type;
a deep well, disposed in the substrate, and having a second conductive type different from the first conductive type;
a first doped region, disposed in the deep well, and having the second conductive type;
a high-voltage well, disposed in the substrate, and having the first conductive type;
a second doped region, disposed in the high-voltage well, and having the second conductive type;
a first gate structure, disposed on the high-voltage well between the first doped region and the second doped region;
a doped channel region, disposed in the high-voltage well and being in contact with the second doped region and the deep well, and the doped channel region having the second conductive type; and
a third doped region, disposed in the high-voltage well, and the third doped region having the second conductive type.

2. The high-voltage semiconductor device according to claim 1, further comprising a fourth doped region, disposed in the high-voltage well, and the fourth doped region having the first conductive type, wherein the fourth doped region is electrically connected to the third doped region.

3. The high-voltage semiconductor device according to claim 2, wherein the third doped region is disposed between the fourth doped region and the second doped region.

4. The high-voltage semiconductor device according to claim 2, wherein the third doped region and the fourth doped region are electrically connected to the substrate.

5. The high-voltage semiconductor device according to claim 1, further comprising a voltage endurance structure, disposed between the first doped region and the high-voltage well.

6. The high-voltage semiconductor device according to claim 5, wherein the deep well, the first doped region, the high-voltage well, the second doped region, the gate structure and the doped channel region constitute a depletion mode high-voltage metal-oxide-semiconductor (HV MOS) transistor.

7. The high-voltage semiconductor device according to claim 5, wherein the voltage endurance structure comprises a first insulating layer, disposed on the deep well between the first doped region and the high-voltage well.

8. The high-voltage semiconductor device according to claim 7, wherein the voltage endurance structure further comprises a plurality of field plates, disposed on the first insulating layer.

9. The high-voltage semiconductor device according to claim 7, wherein the voltage endurance structure further comprises a fifth doped region disposed in the deep well and being in contact with the first insulating layer, and the fifth doped region has the first conductive type.

10. The high-voltage semiconductor device according to claim 7, wherein the first gate structure extends onto the first insulating layer.

11. The high-voltage semiconductor device according to claim 1, further comprising a second gate structure, disposed on the high-voltage well between the second doped region and the third doped region, and the second gate structure comprising a second gate electrode electrically connected to the third doped region.

12. The high-voltage semiconductor device according to claim 11, wherein the second doped region, the third doped region, the high-voltage well and the second gate structure constitute a metal-oxide-semiconductor (MOS) transistor.

13. The high-voltage semiconductor device according to claim 1, wherein the second doped region, the third doped region and the high-voltage well constitute a bipolar junction transistor (BJT).

14. The high-voltage semiconductor device according to claim 1, further comprising a second insulating layer, disposed between the second doped region and the third doped region.

15. The high-voltage semiconductor device according to claim 1, wherein the high-voltage well is disposed in the deep well, and the deep well surrounds the high-voltage well.

16. A high-voltage semiconductor device, comprising:
a depletion mode HV MOS transistor, having a first source and a first drain, wherein the first drain is electrically connected to a high-voltage power, and the first source is electrically connected to an internal circuit, wherein the high-voltage power is electrically connected to the internal circuit only with the depletion mode HV MOS transistor; and
an electrostatic discharge (ESD) protection device, electrically connected between the first source and a ground to provide an ESD path between the first source and the ground.

17. The high-voltage semiconductor device according to claim 16, wherein the ESD protection device is a MOS transistor having a second gate, a second source and a second drain, the second gate and the second source are electrically connected to the ground, and the first source is electrically connected to the second drain.

18. The high-voltage semiconductor device according to claim 17, wherein the depletion mode HV MOS further has a first base, the MOS transistor further has a second base, and the first base and the second base are electrically connected to the ground.

19. The high-voltage semiconductor device according to claim 16, wherein the ESD protection device is a BJT having a emitter, a third base and a collector, the emitter and the third base are electrically connected to the ground, and the collector is electrically connected the first source.

20. The high-voltage semiconductor device according to claim 17, wherein the depletion mode HV MOS further has a first base, the MOS transistor further has a second base, and the first base and the second base are directly electrically connected to the ground.

* * * * *